(12) United States Patent
Leyba, II et al.

(10) Patent No.: US 7,831,415 B1
(45) Date of Patent: Nov. 9, 2010

(54) CIRCUIT FOR TESTING INPUT SIGNALS AND A METHOD OF TESTING INPUT SIGNALS COUPLED TO A CIRCUIT

(75) Inventors: Joe Eddie Leyba, II, Albuquerque, NM (US); Wayne E. Wennekamp, Albuquerque, NM (US); Schuyler E. Shimanek, Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 281 days.

(21) Appl. No.: 12/035,388

(22) Filed: Feb. 21, 2008

(51) Int. Cl.
*G06F 15/00* (2006.01)

(52) U.S. Cl. .................. 702/189; 702/69; 326/16; 326/38; 326/39; 326/41; 714/724; 714/725; 716/4; 716/6; 716/16; 324/76.11

(58) Field of Classification Search .............. 702/38, 702/58, 59, 182, 183, 184, 185, 189, 64, 702/69; 326/16, 37, 38, 39, 41, 63, 80; 716/6, 716/16, 4; 324/76.11
See application file for complete search history.

(56) References Cited

U.S. PATENT DOCUMENTS

| 6,112,020 | A * | 8/2000 | Wright ..................... 716/17 |
| 6,363,505 | B1 * | 3/2002 | Vest et al. ................. 714/726 |
| 6,628,140 | B2 * | 9/2003 | Langhammer et al. ....... 326/40 |
| 6,911,840 | B1 * | 6/2005 | Milne et al. ................ 326/38 |
| 7,068,071 | B1 * | 6/2006 | Milne et al. ................ 326/41 |
| 7,235,999 | B2 * | 6/2007 | Goetting et al. ............... 326/9 |
| 7,266,028 | B1 * | 9/2007 | Dastidar .................... 365/201 |
| 7,301,836 | B1 * | 11/2007 | Raghavan et al. .......... 365/201 |
| 7,359,811 | B1 * | 4/2008 | Liu ........................... 702/69 |
| 7,430,697 | B1 * | 9/2008 | Pabari ....................... 714/724 |
| 7,430,728 | B1 * | 9/2008 | Rahut ........................... 716/6 |
| 7,463,060 | B1 * | 12/2008 | Whitten et al. .............. 326/40 |
| 7,467,176 | B2 * | 12/2008 | Zheng et al. ............... 708/551 |
| 7,571,413 | B1 * | 8/2009 | Dastidar et al. ............. 716/16 |
| 2001/0037482 | A1 * | 11/2001 | Plants ....................... 714/763 |
| 2003/0112031 | A1 * | 6/2003 | Agrawal et al. .............. 326/41 |
| 2003/0122578 | A1 * | 7/2003 | Masui et al. ................. 326/39 |
| 2004/0183564 | A1 * | 9/2004 | Schadt et al. ................. 326/3 |
| 2006/0218216 | A1 * | 9/2006 | Langhammer et al. ...... 708/490 |
| 2008/0309370 | A1 * | 12/2008 | Spangaro .................... 326/38 |
| 2009/0267643 | A1 * | 10/2009 | Lewis et al. ................. 326/38 |
| 2010/0007379 | A1 * | 1/2010 | Langhammer et al. ....... 326/41 |

* cited by examiner

*Primary Examiner*—Carol S Tsai
(74) *Attorney, Agent, or Firm*—John J. King (57) ABSTRACT

A method of testing input signals coupled to a circuit for performing a predetermined function is disclosed. The method comprises coupling input signals to inputs of the circuit by way of programmable interconnects; controlling the paths of the input signals within the circuit from the inputs to an output of the circuit; maintaining the states of the input signals coupled to the inputs of the circuit and routed to the output of the circuit; and testing output signals of the circuit to determine whether the correct input signals were provided to the inputs of the circuit by way of the programmable interconnects. A device having programmable logic which enables testing of input signals is also disclosed.

20 Claims, 10 Drawing Sheets

| | DSP in normal operation (UT1, UT0 = 0, 0) | DSP configured to pass C inputs (UT1, UT0 = 0, 1) | DSP configured to pass D, A, and B inputs (UT1, UT0 = 1, 0) | DSP in normal operation (UT1, UT0 = 1, 1) |
|---|---|---|---|---|
| CREG_EN | CREG_EN | 0 | x | CREG_EN |
| CYREG_EN | CYREG_EN | 0 | 0 | CYREG_EN |
| PREG_EN | PREG_EN | 0 | 0 | PREG_EN |
| OM[5] | OM[5] | 0 | 0 | OM[5] |
| OM[4] | OM[4] | x | 0 | OM[4] |
| OM[3] | OM[3] | 1 | 0 | OM[3] |
| OM[2] | OM[2] | 1 | 0 | OM[2] |
| OM[1] | OM[1] | 0 | 1 | OM[1] |
| OM[0] | OM[0] | 0 | 1 | OM[0] |
| CYSEL | CYSEL | 1 | 1 | CYSEL |
| SUBA | SUBA | 0 | 0 | SUBA |
| B0REG_EN | B0REG_EN | x | 0 | B0REG_EN |
| B1REG_EN | B1REG_EN | x | 0 | B1REG_EN |
| A0REG_EN | A0REG_EN | x | 0 | A0REG_EN |
| A1REG_EN | A1REG_EN | x | 0 | A1REG_EN |
| BSEL | BSEL | x | 0 | BSEL |
| DREG_EN | DREG_EN | x | 0 | DREG_EN |

CIRCUIT FOR TESTING INPUT SIGNALS AND A METHOD OF TESTING INPUT SIGNALS COUPLED TO A CIRCUIT

FIELD OF THE INVENTION

The present invention relates generally to integrated circuits, and in particular, to a method of testing input signals coupled to a circuit.

BACKGROUND OF THE INVENTION

Integrated circuits are an integral part of any electronic device. A variety of integrated circuits are often used together to enable the operation of the electronic device. While integrated circuits are typically designed for a particular application, one type of integrated circuit which enables flexibility is a programmable logic device (PLD). A programmable logic device is designed to be user-programmable so that users may implement logic designs of their choices. One type of programmable logic device is the Complex Programmable Logic Device (CPLD). A CPLD includes two or more "function blocks" having a two-level AND/OR structure connected together and to input/output (I/O) resources by an interconnect switch matrix. Another type of programmable logic device is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., FLASH memory, as in some CPLDs), or in any other type of memory cell.

PLDs also have different "modes" depending on the operations being performed on them. A specific protocol allows a programmable logic device to enter into the appropriate mode. Typical PLDs have internal blocks of configuration memory which specify how each of the programmable cells will emulate the user's logic. During a "program" mode, a configuration bitstream is provided to non-volatile memory, such as a read-only memory (ROM) (e.g. a programmable ROM (PROM), an erasable PROM (EPROM), or an electrically erasable PROM (EEPROM)) either external or internal to the programmable logic device. Each address is typically accessed by specifying its row and column addresses. During system power up of a "startup" mode, the configuration bits are successively loaded from the non-volatile memory into static random access memory (SRAM) configuration latches of a configurable logic block.

As will be described in more detail in references to specific embodiments of the invention, various blocks of a PLD are repeated in the device. One example of such a block is a block implementing a multiplier/accumulator (MACC), which is used in digital signal processor (DSP) blocks. In order to provide a PLD having DSP functionality to a customer, it is important that the DSP blocks are tested to determine that they are functioning properly. One aspect of testing a DSP block is to determine whether the inputs to a DSP block are correctly receiving input signals. That is, it is necessary to determine whether the paths from a source of the input signals to the inputs of the circuit are enabling the input signals to arrive at the inputs of the circuit. While the test itself is important in any device implementing DSP blocks, the test is particularly beneficial in a programmable logic device, where programmable interconnects enable paths to the inputs to be re-routed if the correct input signals are not arriving at the inputs.

Figure 1:
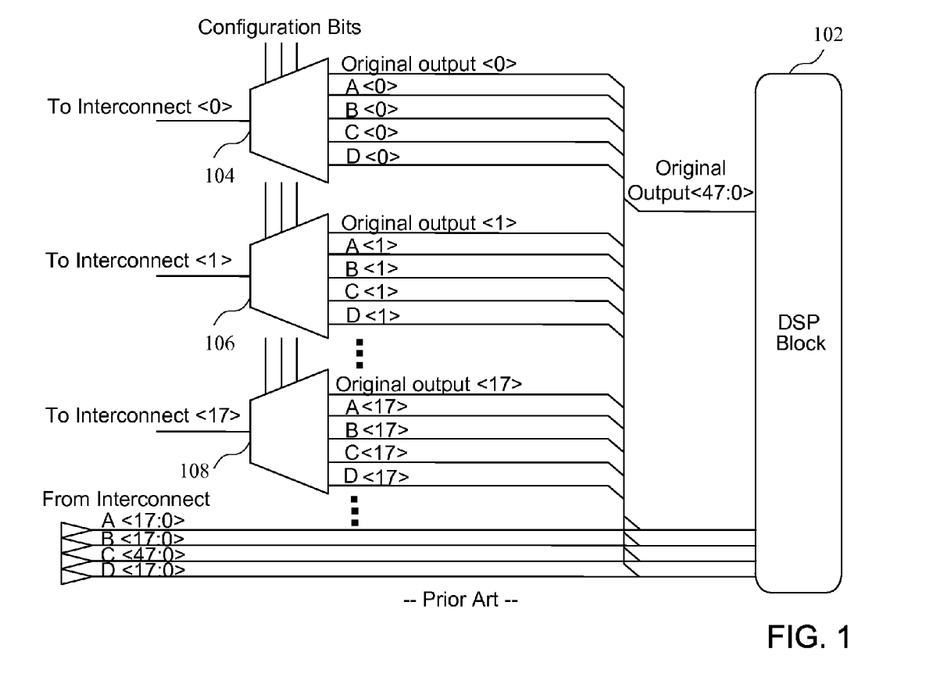
FIG. 1 is a block diagram of a conventional circuit for testing inputs to a circuit block.

Conventional methods of testing the paths to the inputs of a DSP block or other circuit block require placing a multiplexer at the output, where the multiplexer is coupled to receive the block inputs and the block output. In particular, as shown in FIG. 1, a conventional circuit may include multiplexers outside of the DSP block to select either a bit of the output of the DSP, or an input bit. During test, configuration bits functioning as select lines for the multiplexers are used to connect the block inputs to the output through the multiplexer. For example, four multiple-bit inputs A-D which are couple to the DSP block are also routed to a group of multiplexers, each receiving one bit of each of the inputs A-D. The disadvantage of circuit of FIG. 1 is that the insertion of the multiplexers reduces performance by adding extra gates. The circuit of FIG. 1 also adds more load to the DSP block, and delays the inputs into the DSP block from programmable interconnects and from the output of the DSP block to the programmable interconnects. The additional multiplexers may also lead to a substantial increase in size of the circuit required to implement a DSP.

Accordingly, there is a need for a way to verify all of the inputs coupled to a circuit block, while minimizing the circuit requirements and the impact of the circuits testing the inputs on the performance of the circuit block.

SUMMARY OF THE INVENTION

A method of testing input signals coupled to a circuit for performing a predetermined function is disclosed. The method includes coupling input signals to inputs of the circuit by way of programmable interconnects; controlling the paths of the input signals within the circuit from the inputs to an output of the circuit; maintaining the states of the input signals coupled to the inputs of the circuit and routed to the output of the circuit; and testing output signals of the circuit to determine whether the correct input signals were provided to the inputs of the circuit by way of the programmable interconnects. The method may include controlling paths within the circuit by multiplexing inputs to predetermined nodes of the circuit. The method may further include providing an arithmetic function implemented in the circuit, wherein selecting paths within the circuit includes controlling input signals to arithmetic operators to pass predetermined input signals. The circuit may be implemented as a digital signal processing block, wherein selecting paths within the circuit includes controlling inputs to an adder of the digital signal processing block.

According to an alternate embodiment, a method of testing input signals coupled to a circuit for performing a predetermined function includes implementing a digital signal processing block in a device; coupling input signals to inputs of the digital signal processing block by way of programmable interconnects; controlling the paths of the input signals within the digital signal processing block from the inputs to an output of the digital signal processing block; maintaining the states of predetermined input signals coupled to the inputs of the digital signal processing block and routed to the output of the digital signal processing block; and testing the output signals of the digital signal processing block to determine whether the correct input signals were provided to the inputs of the digital signal processing block by way of the programmable interconnects. The method may further include cou-
pling control signals within the device to enable testing the interconnect circuits coupling the input signals to the digital signal processing block. After coupling test signals to inputs of the digital signal processing block, wherein testing the output signals includes comparing the output signals of the digital signal processing block to the test signals coupled to the programmable interconnects. The programmable interconnects coupling signals to the digital signal processing block may be re-routed if the output signals of the digital signal processing block are different than the test signals coupled to the programmable interconnects.

A device configured to implement a predetermined function is also disclosed. The device includes programmable interconnect circuits coupled to receive input signals; and a circuit block coupled to the programmable interconnect circuits and implemented in programmable logic for performing arithmetic functions, wherein control signals coupled to the circuit block selectively enable arithmetic operators to pass predetermined input signals to the circuit block to an output of the circuit block to enable testing the input signals to the circuit block. The circuit block may include multiplexers for enabling the arithmetic operators to pass predetermined input signals, wherein the circuit block receives control bits for configuring the circuit block in a test mode or in an arithmetic mode. The circuit block may include a digital signal processing block, wherein input signals to the digital signal processing block are controlled to pass predetermined inputs.

DETAILED DESCRIPTION OF THE DRAWINGS

Figure 2:
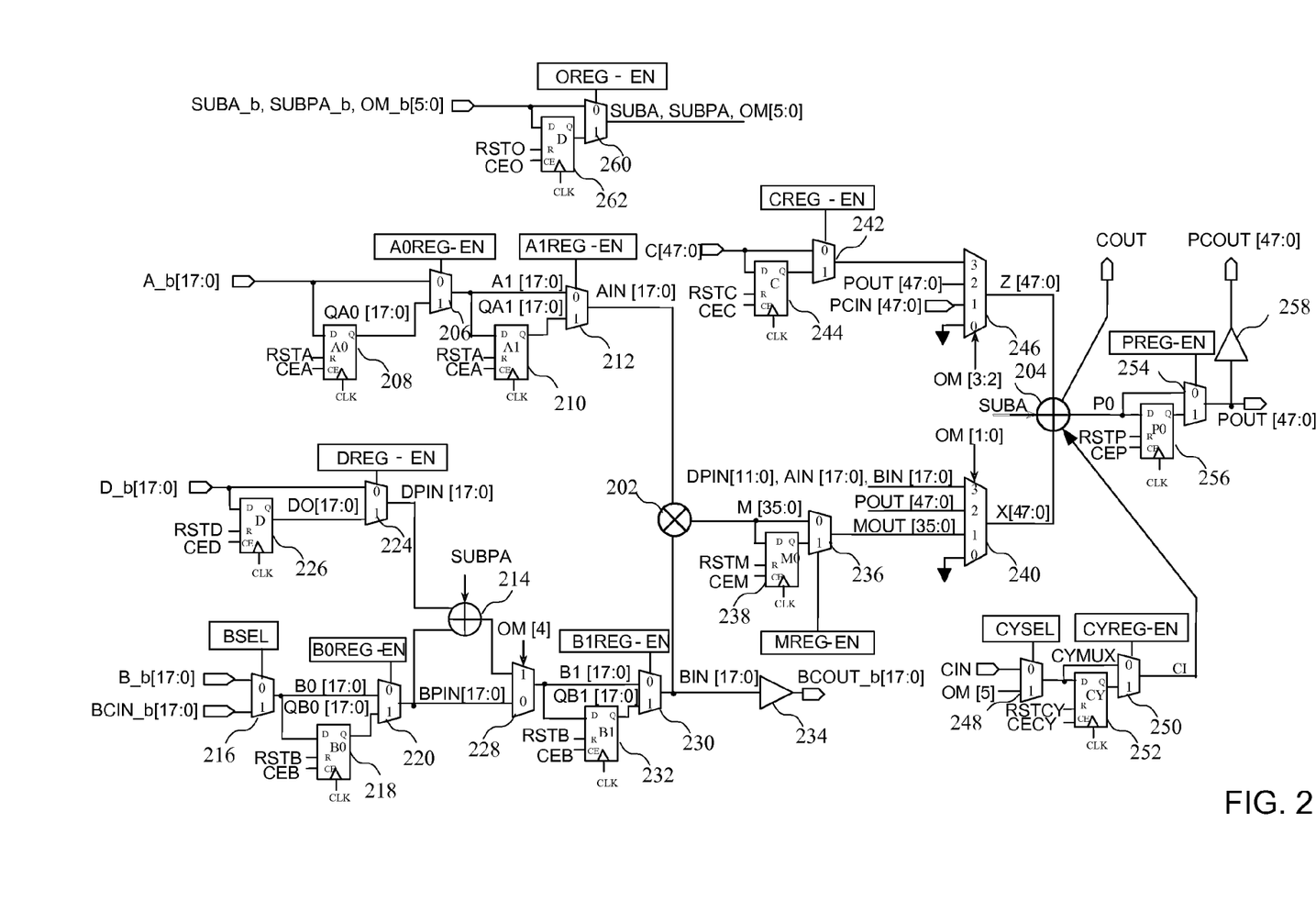
FIG. 2 is a block diagram of a circuit for testing inputs to a circuit block according to an embodiment of the present invention.

Turning first to FIG. 2, a block diagram of a circuit for testing inputs to a circuit block according to an embodiment of the present invention is shown. In particular, the DSP circuit of FIG. 2 includes arithmetic operators, such as a multiplier 202 and an adder 204 which are coupled to an output POUT. The circuit may include various inputs to the multiplier or adder. According to the exemplary DSP of FIG. 2, the multiplier 202 is coupled to receive a first input AIN [17:0] generated by a circuit including a multiplexer 206 coupled to receive an input A_b[17:0] and a registered input QA0[17:0] provided by a register 208. The output A1[17:0] of the multiplexer 206, selected by an A0REG-EN signal, and a registered output QA1[17:0] of register 210 are coupled to a multiplexer 212. The output of the multiplexer 212 is selected by a control signal A1REG-EN and coupled to the multiplier 202.

A second input to the multiplier may include an output of an adder 214 coupled to receive a B input and a D input. In particular, a multiplexer 216 controlled by a signal BSEL is coupled to receive an input B_b[17:0] or a carry input BCIN_b[17:0] and generate a signal BO[17:0]. The signal BO[17:0] is coupled along with a registered version QBO[17:0] of a register 218 to a multiplexer 220 controlled by a control signal BOREG_EN. The second input to the adder 214 includes an output DPIN[17:0] of the multiplexer 224 which is controlled by a DREG_EN signal and coupled to receive an input D_b[17:0] and a registered version DO[17:0] output by a register 226. The output of the adder 214 and the selected output of the multiplexer 220 including an input signal BPIN[17:0] are coupled to a multiplexer 228 controlled by a signal OM[4]. The output B1[17:0] of the multiplexer 228 is coupled to a first input of a multiplexer 230, which is also coupled to receive a registered output QB1[17:0] of register 232 and generate a signal BIN[17:0] in response to a control signal B1REG_EN. A buffer 234 is coupled to receive BIN[17:0] and generate an output BOURT_B[17:0].

The output M[35:0] of the multiplier 202 is coupled to a multiplexer 236, which is also coupled to receive a registered output of a register 238 and is controlled by a control signal MREG_EN. The output MOUT[35:0] of multiplexer 236 is coupled to an input of a multiplexer 240, also known as the X-multiplexer, which is also coupled to receive the output POUT[47:0] of the circuit, a concatenated input including DPIN[11:0], AIN[17:0], and BIN[17:0], and a ground signal. The multiplexer 240 is controlled by a two-bit control signal OM[1:0] to generate an output X[47:0]. Because the DPIN [11:0], AIN[17:0], and BIN[17:0] signals are input to the multiplexer 240, these input signals may be routed directly to the outputs of the DSP block. That is, the paths of the input signals A_b[17:0], B_b[17:0] and D_b[17:0] may be controlled within the circuit from the input to the output of the circuit such that states of the input signals are maintained between the input and output of the DSP block. As will be described in more detail below, a 48-bit input C[47:0] may be controlled by a separate multiplexer to route this signal directly to the outputs of the DSP block to test whether it had also been correctly received by the DSP block.

In particular, the C input C[47:0] is coupled to a multiplexer 242 along with a registered input provided by a register 244. The multiplexer 242 is controlled by a control signal CREG_EN and has an output which his coupled to a multiplexer 246, also known as the Z-multiplexer. The multiplexer 246 is also coupled to receive the output POUT[47:0], a carry-in signal PCIN[47:0] and a ground signal. The multiplexer 246 is controlled by a control signal OM[3:2] to generate an output Z[47:0]. A carry-in signal (CI) is also coupled to the adder 204 by way of a multiplexer 248, also known as the CY-multiplexer, coupled to receive a carry-in CIN signal and OM[5]. The multiplexer 248 is controlled by a control signal CYSEL to generate an output CYMUX which is coupled to a multiplexer 250, which also receives a registered value provided by register 252. The output of the multiplexer 250 selected by CYREG-EN is coupled to the adder 204. The output of the adder PO is coupled to a multiplexer 254 and a register 256, the output of which is also coupled to the multiplexer 254. The output of the multiplexer is controlled by PREG_EN to generate the output of the circuit POUT[47:0]. A carry out signal PCOUT[47:0] is also generated by a buffer 258. Finally, a multiplexer 260 is coupled to receive a signal including SUB_b, SUBP_b, and OM_b[5:0] and a registered output by register 262. The multiplexer 260 is controlled by a control signal OREG-EN to generate SUBA, SUBPA, OM[5:0], where SUBA is coupled to the adder 204. As will be described in more detail in reference to FIGS. 8 and 9 below, a single stage multiplexer coupled to receive a 4-bit input may be employed for multiplexers 240 and 246 to increase the speed of the circuit.

Figure 3:
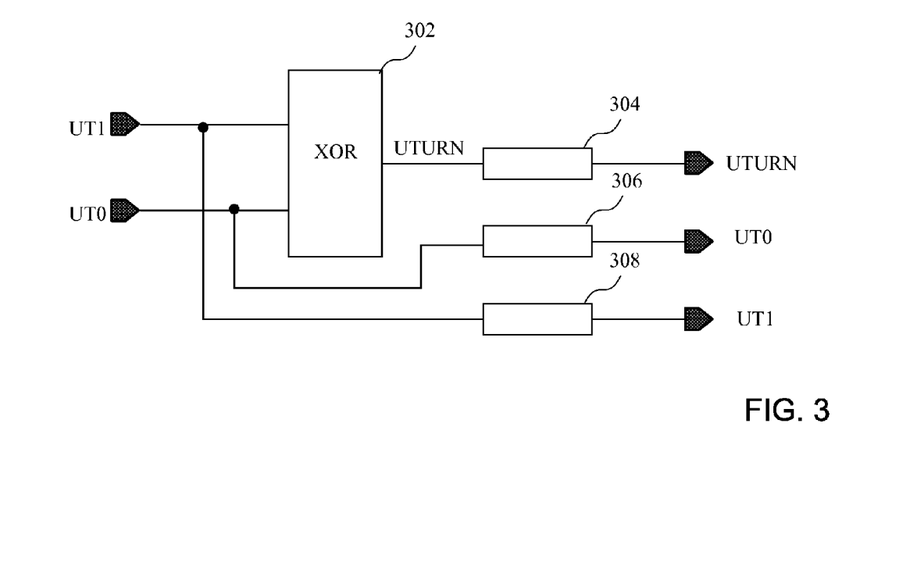
FIG. 3 is a block diagram of a circuit for generating signals to enable testing according to an embodiment of the present invention.

While the circuit of FIG. 2 may be employed as a DSP block, and controlled by various configuration bits to perform a predetermined arithmetic function, circuits may be employed in the device to override the various configuration bits to enable the DSP block itself to provide the u-turn functionality to test the inputs to the DSP block. That is, rather than adding the additional circuits external to the DSP block which would have a greater impact on the performance of the DSP block, circuits may be employed to override the selection signals of the multiplexers of the DSP block to enable the inputs to the DSP block to be generated at the output of the DSP block in the same state. Accordingly, while testing, no changes are made to the stored selection signals for the multiplexers, enable the tester to test the circuit block with no change to the circuit. That is, the testing operation of the inputs of the DSP block is transparent to the user of the DSP block. A block diagram of FIG. 3 shows a circuit for generating signals to enable testing according to an embodiment of the present invention. Because there are three states in which the circuit of FIG. 2 may operate, a two-bit signal including UT0 and UT1 is used to generate a "u-turn" signal UTURN, indicating that input data provided to the circuit should be read out of the DSP block to determine whether the programmable interconnects providing paths for coupling the data to the inputs of the DSP block are functioning. In particular, the circuit of FIG. 2 may operate in a normal mode, where the DSP block provides its normal multiplier/accumulator functionality. In a second mode, the UTURN signal and the states of UT0 and UT1 enable overriding the various control signals for the multiplexers of FIG. 2 to route the inputs to the DSP block to be generated at output in the same states as they were input. That is, inputs to the arithmetic operators are selected to enable a given input to DSP block to be output unchanged. Accordingly, when either UT1 or UT0 are high, or a logical "1," the UTURN signal generated by an exclusive OR circuit 302 is high. Each of the UTURN, UT0 and UT1 signals are buffered by buffer circuits 304, 306 and 308, respectively, to generate the corresponding output signals. The UTURN signal and the individual UT1 and UT0 signals are used to override the stored values which control the multiplexers, as will be described in more detail in reference to FIGS. 4-6.

Figure 4:
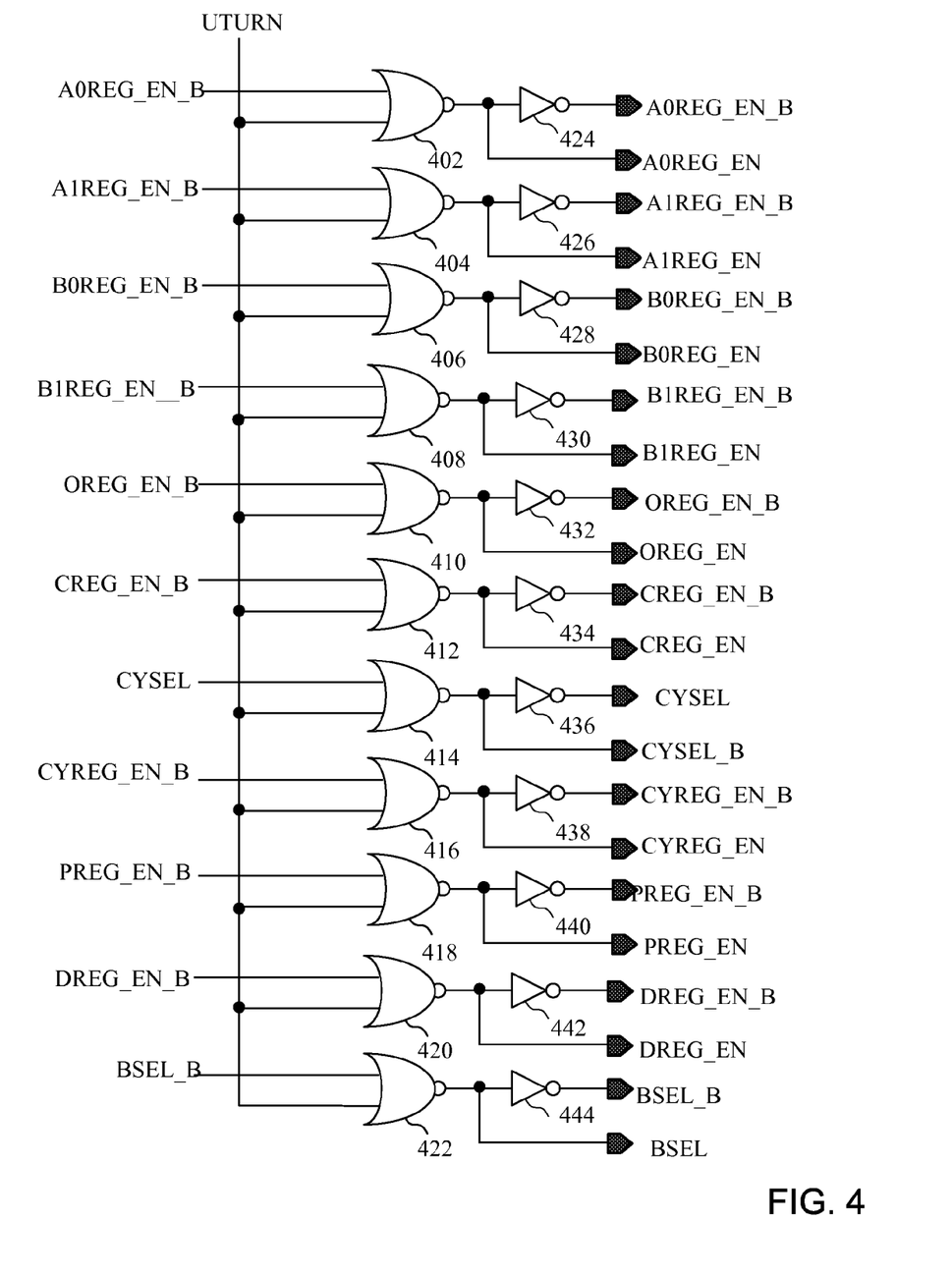
FIG. 4 is a block diagram of a circuit for generating multiplexer control signals for the circuit of FIG. 2 according to an embodiment of the present invention.

Turning now to FIG. 4, a block diagram of a circuit for generating multiplexer control signals for the circuit of FIG. 2 according to an embodiment of the present invention is shown. In particular, the circuit of FIG. 4 includes NOR gates 402-422, each of which is coupled to receive the UTURN signal and another signal to generate a corresponding enable signal. The other signals coupled to the NOR gates 424-444 may include configuration bits stored in configuration memory cells for configuring programmable logic blocks, such as DSP blocks of a programmable logic device, for example. Each of the outputs of the NOR gates is coupled to an inverter to generate an inverted signal corresponding to the input signal when UTURN is low. While the inputs signals coupled to the NOR gates 402-422 represent the stored values for implementing an arithmetic function in the DSP block, the outputs of the inverters 424-444 are coupled to the selection inputs of the multiplexers as shown in FIG. 2. As can be seen, the inputs to the NOR gates may be overridden when the UTURN signal is high. That is, if either input to a NOR gate is high, the output is always low. As will be described in reference to FIG. 6, the various output signals of the circuit of FIG. 4 enable passing the input signals coupled to the DSP block to the output so that the signals may be tested.

Figure 5:
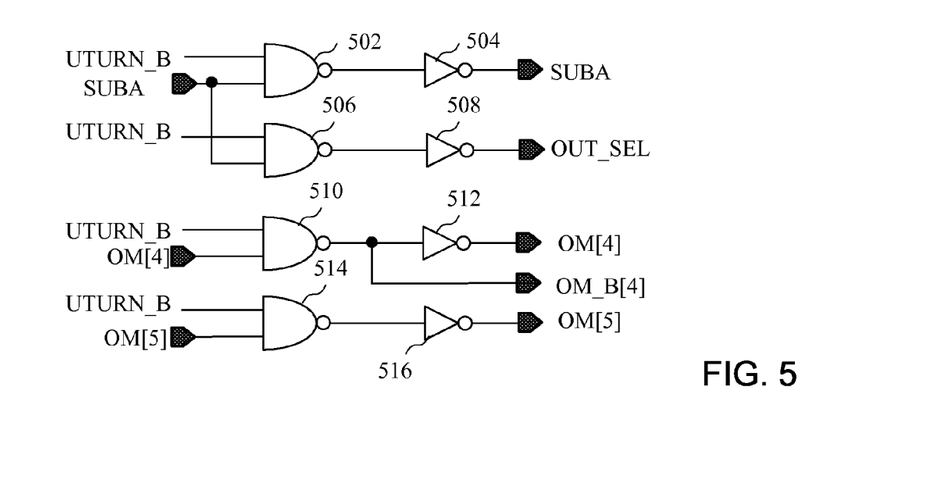
FIG. 5 is a block diagram of a circuit for generating additional multiplexer control signals for the circuit of FIG. 2 according to an embodiment the present invention.

As shown in FIG. 5, a circuit generates additional multiplexer control signals for the circuit of FIG. 2. In particular, the inverted UTURN signal (UTURN_B) is coupled to a plurality of NAND gates, the outputs of which are coupled to corresponding inverters, to generate other signals which set control signals for multiplexers. Whenever an input to a NAND gate is low, such as when UTURN is high and UTURN_B is low, the output of the NAND gate is high. A first NAND gate 502 is also coupled to receive SUBA_IN, wherein the inverted output of the NAND gate at the output of inverter 504 is the SUBA signal. The SUBA_IN signal is also coupled to the NAND gate 506, wherein the inverted output of the NAND gate at inverter 508 is the OUT_SEL signal. A NAND gate 510 and corresponding inverter 512 are used to generate a value of OM[4] based upon the value of the input OM4 and UTURN_B. Finally, a NAND gate 514 and corresponding inverter 516 are used to generate a value of OM[5] based upon the value of the input OM5 and UTURN_B. While the circuit of FIG. 5 is shown using NAND gates coupled to receive the inverted u-turn signal, UTURN_B, the circuit of FIG. 5 could be implemented using NOR gates, while the circuit of FIG. 4 could be implemented using NAND gates. That is, the circuits of FIGS. 4 and 5 are shown by way of example, but may be implemented using other logic gates based upon available resources of the device.

Figure 6:
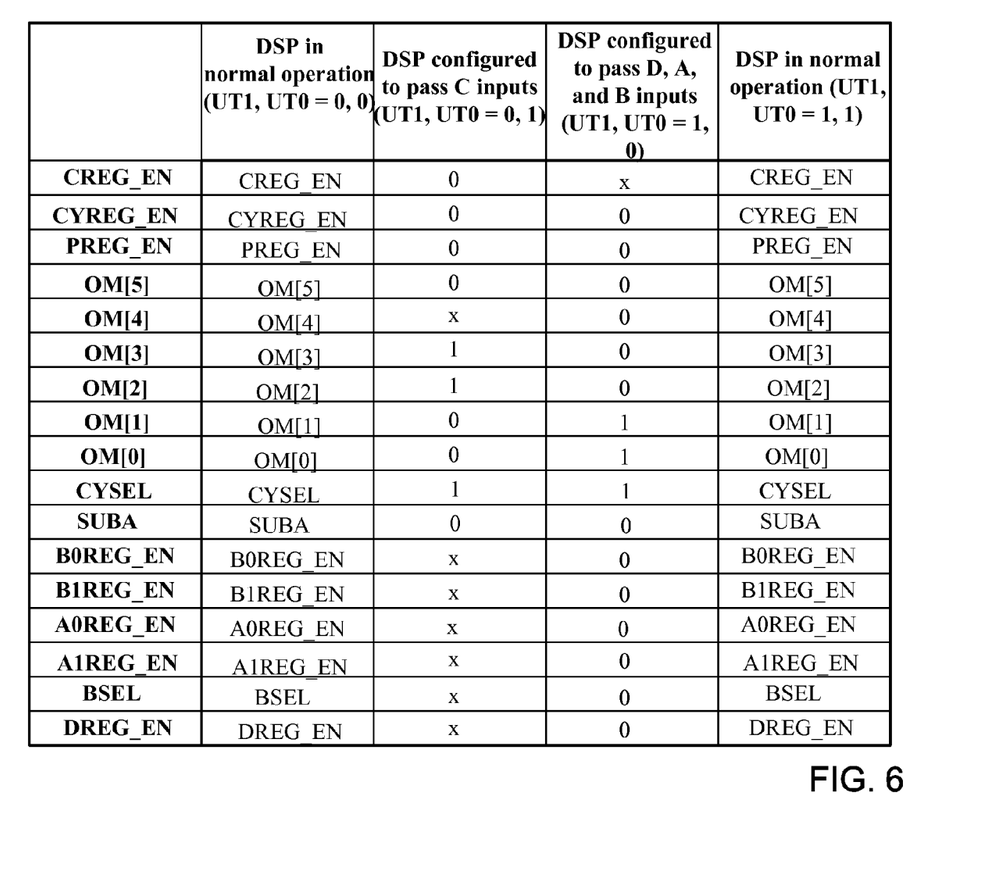
FIG. 6 is a table showing control signal states enabling testing inputs to a circuit block according to an embodiment of the present invention.

Turning now to FIG. 6, a table shows control signal states enabling testing inputs to a circuit block according to an embodiment of the present invention.

As can be seen in the table, when both inputs UT1 and UT0 are either a logical "0" or a logical "1," the DSP is in normal operational mode. In this case, the inputs to the circuit elements of FIG. 2 include the values stored in the device. However, the circuit may be configured to pass the "C" inputs or the "A," "B" and "D" inputs of FIG. 2. In the case of passing the "C" inputs or the "A," "B" and "D" inputs, the values of the table must be set as shown in the middle two columns. In particular, when it is desired to pass the "C" inputs, UT1 and UT0 are set to 0 and 1, respectively, which will lead to the values of the table for passing "C" inputs according to the circuit of FIGS. 4 and 5. It should be noted that while OM[4] and OM[5] are generated by the circuit of FIG. 5, OM[3:0] are set as an input to multiplexer 260 of FIG. 2. All of the values required for passing the "C" inputs are either a logical "0" or an "x" (don't care) value, except OM[3] and OM[2] which are set to a logical "1." The necessary circuit elements of FIG. 2 for passing the "C" inputs will be shown in more detail in reference to FIG. 7. When it is desired to pass the "A," "B" and "D" inputs, UT1 and UT0 are set to 1 and 0, respectively, which will lead to the values of the table for passing the "A," "B" and "D" inputs. In this case, all of the values are either a logical "0" or an "x" (don't care) value, except OM[1] and OM[0] which are set to a logical "1," and CYSEL, which is also a logical "1." The necessary circuit elements of FIG. 2 for passing the "A," "B" and "D" inputs will be shown in more detail in reference to FIG. 8.

Figure 7:
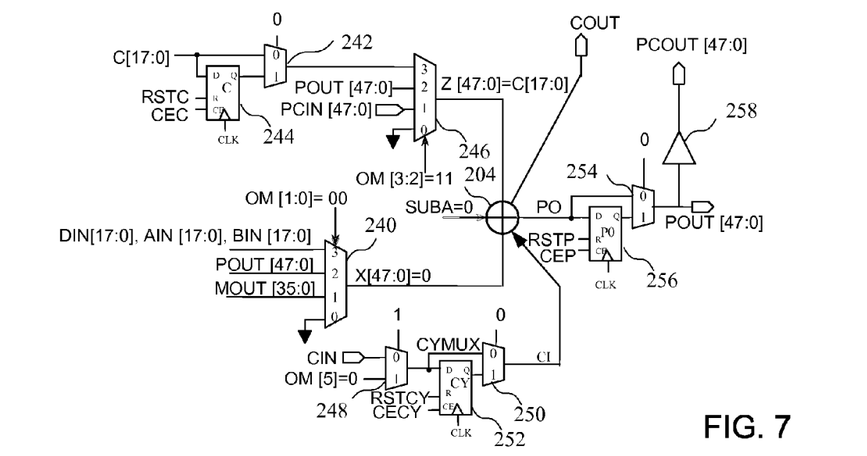
FIG. 7 is a simplified block diagram according to the circuit of FIG. 2 for passing "C" inputs from an input to an output of the circuit block according to an embodiment of the present invention.

As shown in FIG. 7, a simplified block diagram according to the circuit of FIG. 2 enables passing "C" inputs from an input to an output of the circuit block when the values of the table of FIG. 6 for passing the "C" inputs are applied to the multiplexers of the circuit of FIG. 2. That is, CREG_EN=0 to bypass the C register;
CYREG_EN=0 to bypass the CY register;
PREG_EN=0 to bypass the P register;
OM[3] & OM[2]=1 to select C input in the Z-multiplexer;
OM[1] & OM[0]=0 to select zero in the X-multiplexer;
CYSEL=1 & OM[5]=0 so that the carry in is zero; and
ISUBA=0 so the accumulator performs an add C+0.

As can be seen, the C inputs are output in the same state that they are provided to the circuit of FIG. 2 when the control signal values are implemented according to the table of FIG. 6.

Figure 8:
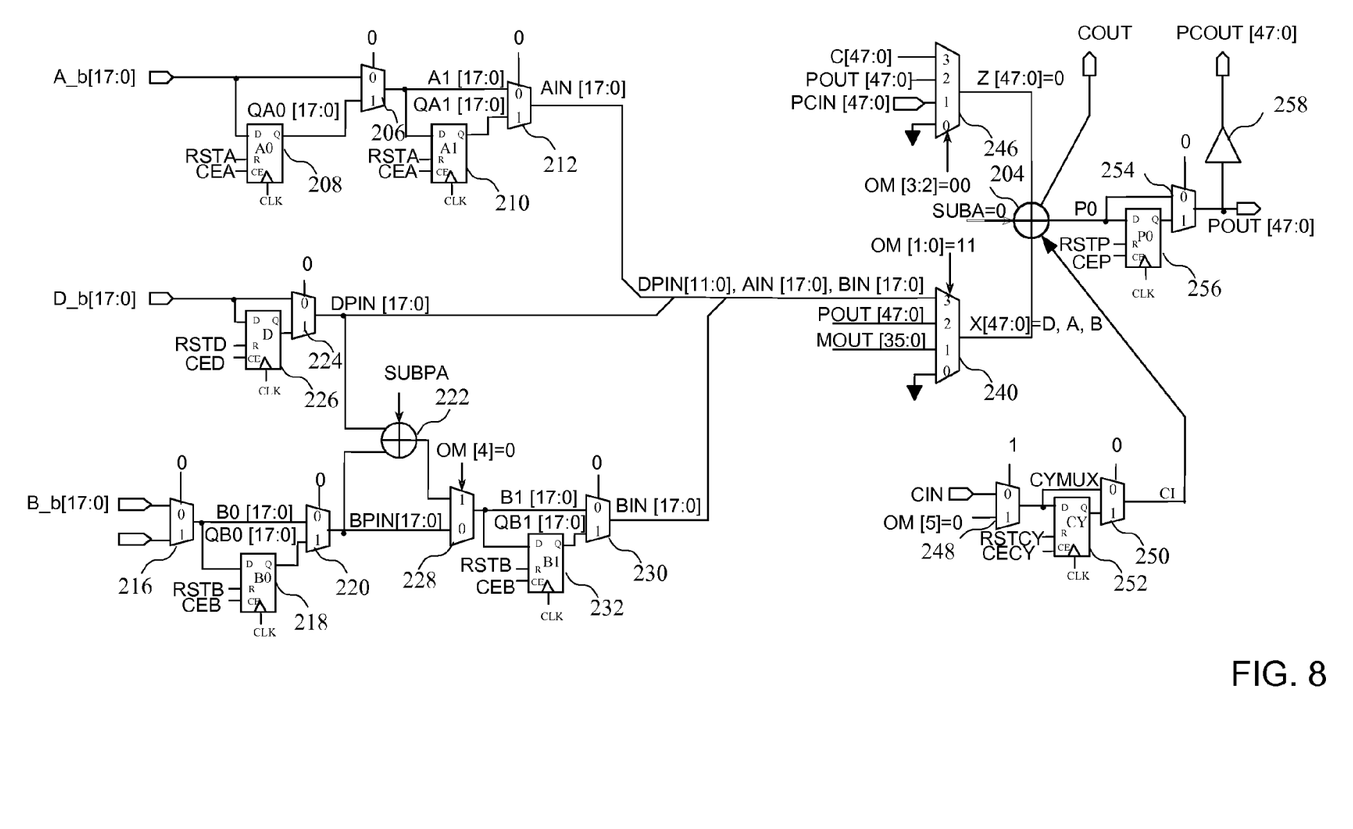
FIG. 8 is a simplified block diagram according to the circuit of FIG. 2 for passing "A," "B" and "D" inputs from an input to an output of the circuit block according to an embodiment of the present invention.

Similarly, as shown in FIG. 8, a simplified block diagram according to the circuit of FIG. 2 enables passing the "A," "B" and "D" inputs from an input to an output of the circuit block when the values of the table of FIG. 6 for passing those inputs are applied to the multiplexers of the circuit of FIG. 2. That is, B0REG_EN & B1REG_EN=0 to bypass the B0 & B1 registers;
A0REG_EN & A1REG_EN=0 to bypass the A0 & A1 registers;
DREG_EN=0 to bypass the D register;
CYREG_EN=0 to bypass the CY register;
PREG_EN=0 to bypass the P register;
OM[3] & OM[2]=0 to select zero in the Z-multiplexer;
OM[1] & OM[0]=1 to select A, B and D inputs in the X-multiplexer;
CYSEL=1 & OM[5]=0 so that the carry in is zero;
ISUBA=0 so the accumulator performs an add 0+DAB;
OM[4]=0 so the pre-adder path is not selected; and
BSEL=0 selects the B input instead of the BCIN As can be seen, the "A," "B" and "D" inputs are output in the same state that they are provided to the circuit of FIG. 2 when the control signal values are implemented according to the table of FIG. 6. By using the existing circuits of the DSP block and selecting certain inputs to arithmetic operators of the DSP block, the u-turn functionality may be implemented using existing circuitry and reduce the delay of the DSP block when the DSP block is implemented in the circuit to perform an arithmetic function.

Figure 9:
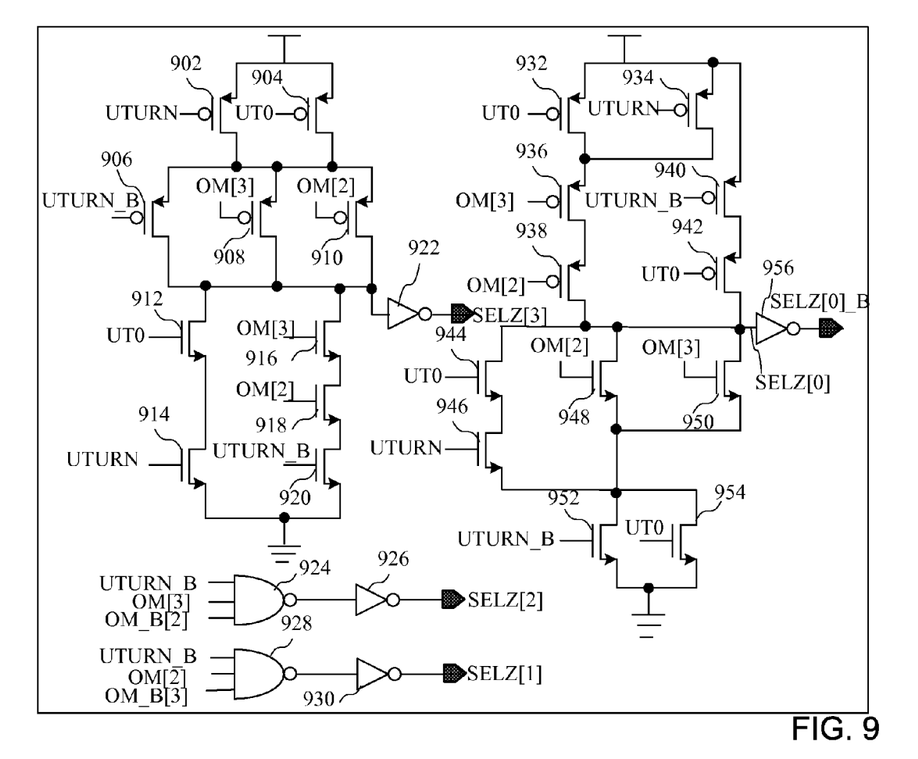
FIG. 9 is a block diagram of a circuit for generating selection signals for a Z-multiplexer of the circuit of FIG. 2 according to an embodiment of the present invention.

Turning now to FIG. 9, a block diagram of a circuit for generating selection signals for a Z-multiplexer of the circuit of FIG. 2 according to an embodiment of the present invention is shown. As set forth above, the speed of the circuit may be increased by using a single stage multiplexer, where a 4-bit selection signal exclusively selects one of the inputs to the multiplexer. In particular, the circuit of FIG. 9 generates SELZ[3:0] signals for selecting one of the inputs to the multiplexer 246, wherein SELZ[x] will select the "x" input. As will be described in more detail below, when the UTURN signal is low in the event that either UT1 and UT0 are both "0" or both "1," indicating normal operation, the OM[3:2] inputs in the circuit are used to generate the selection signals SELZ [3:0]. However, in the event that only one of UT0 or UT1 is high, UTURN is high, enabling the OM[3] and OM[2] signals to be overridden to generate SELZ[3:0]. In that case, SELZ [3:0] signals will be generated to enable the "C" inputs to be provided to the output as set forth above in reference to FIG. 7. That is, SELZ[Z] will be high to select C[17:0].

The circuit of FIG. 9 includes an arrangement of P-channel and N-channel transistors. Parallel P-channel transistors 902 and 904 are coupled to a power signal at their sources, and receive the UTURN signal and UT0 signal at their gates, respectively. The drains of the transistors are coupled to the sources of three other transistors coupled in parallel. In particular, the sources of the P-channel transistors 906, 908 and 910 are coupled to the drains of transistors 902 and 904, and are coupled to receive UTURN_B, OM[3] and OM[2] at their gates, respectively. The drains of the transistors 908-910 are also coupled to drains of an N-channel transistor 912 coupled in series with an N-channel transistor 914 to ground. Transistor 912 receives UT0 at its gate while transistor 914 receives UTURN at its gate. A second series of transistors 916-920 are coupled between the drains of transistors 908-910 and ground, where transistor 916 receives OM[3] at its gate, transistor 918 receives OM[2] at its gate, and transistor 920 receives UTURN_B at its gate. The signal at the node between the P-channel transistors and the N-channel transistors is coupled to an inverter 922, the output of which is the SELZ3 signal. A first NAND gate 924 is coupled to receive UTURN_B, OM[3], and OM_B[2], wherein the output is coupled to an inverter 926 which generates the SELZ2 signal. A second NAND gate 928 is coupled to receive UTURN_B, OM_B[2], and OM_B[3], wherein the output is coupled to an inverter 930 which generates the SELZ1 signal.

Finally, SELZ0 is generated by another set of P-channel and N-channel transistors. In particular, parallel P-channel transistors 932 and 934 are coupled to receive UT0 and UTURN at their gates, respectively, the drains of which are coupled to the source of a P-channel transistor 936 coupled in series with another P-channel transistor 938. The transistors 936 and 938 receive OM[3] and OM[2] signals at their gates, respectively. A second series of P-channel transistors 940 and 942 are also coupled between voltage source and a node at the drain of a number of N-channel transistors. The transistors 940 and 942 receive UTURN_B and UT0 at their gates, respectively. The node at the drains of transistors 938 and 942 are also coupled to a first series of N-channel transistors 944 and 946 coupled to receive UT0 and UTURN at their gates, respectively. A pair of N-channel transistors 948 and 950 are coupled in parallel to the node at the drains of transistors 938 and 942 and the source of transistor 946 and receive OM[2] and OM[3] at their gates, respectively. The node at the sources of transistors 946, 948 and 950 are coupled to the drains of a pair of parallel N-channel transistors 952 and 954 which are coupled to ground and receive UTURN_B and UT0 at their gates. The signal at the node between the P-channel and N-channel transistors includes the SELZ0 signal, which is coupled to an inverter 956 to generate SELZ0_B signal.

Figure 10:
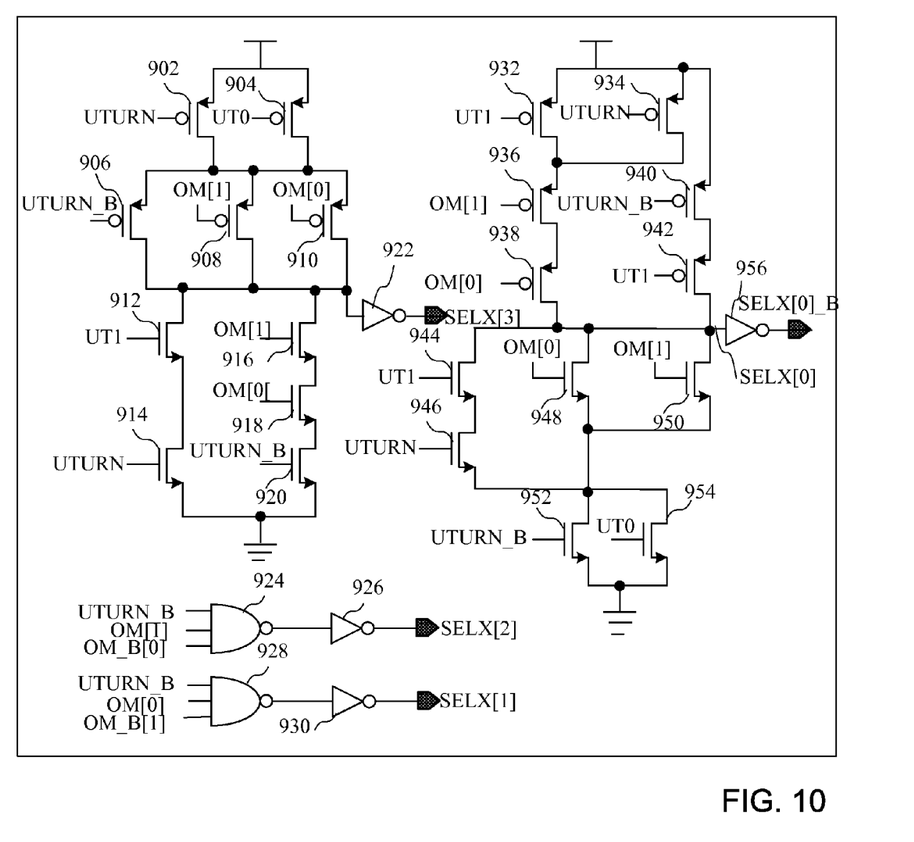
FIG. 10 is a block diagram of a circuit for generating selection signals for an X-multiplexer of the circuit of FIG. 2 according to an embodiment of the present invention.

In operation, whenever the UTURN signal is high, the SELZ[3:0] signals are generated based upon the values of the UTURN, UT1 and UT0 regardless of the values of the OM[3: 2] signal. In contrast, when the UTURN signal is low, indicating normal operation, the SELZ[3:0] signals are based upon the OM[3:2] signals to select an input. When UTURN is high, either the ground input to multiplexer 246 or the C[17:0] input will be selected. Accordingly, ZSEL[2] and ZSEL[1] will always be zero. As shown in FIG. 9, whenever UTURN is high, UTURN_B is low, generating a high output of the NAND gates 924 and 928, or a low output of inverters 926 and 930. Further, when the C[17:0] inputs are to be selected in the test mode, UTURN is high and UT0 is high, resulting in a high SELZ3 signal and a low SELZ0 signal. In contrast, when the ground input is to be selected in the test mode, UTURN is high and UT0 is low, resulting in a high SELZ0 signal and a low SELZ3 signal. As shown in FIG. 10, the circuit for generating selection signals for an X-multiplexer of the circuit of FIG. 2 is the same as the circuit for generating selection signals for the Z-multiplexer of FIG. 9 except that UT1 is used in place of UT0, and OM[1] and OM[0] are used in place of OM[3] and OM[2], respectively.

Figure 11:
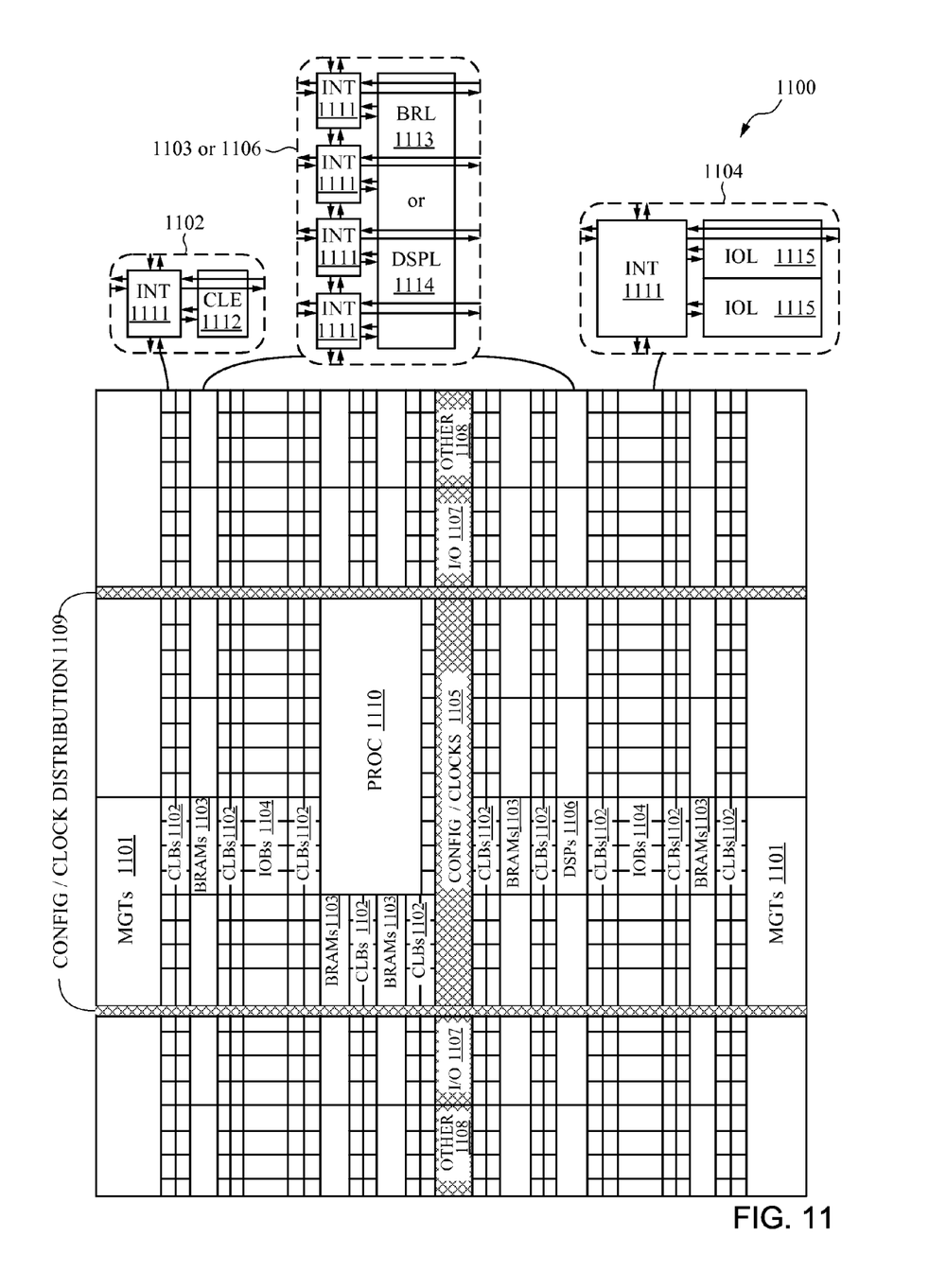
FIG. 11 is a block diagram of a programmable logic device according to an embodiment of the present invention.

Turning now to FIG. 11, a block diagram of a programmable logic device according to an embodiment of the present invention is shown. For example, FIG. 11 illustrates an FPGA architecture that includes a large number of different programmable tiles including programmable logic including multi-gigabit transceivers (MGTs 1101), configurable logic blocks (CLBs 1102), random access memory blocks (BRAMs 1103), input/output blocks (IOBs 1104), configuration and clocking logic (CONFIG/CLOCKS 1105), digital signal processing blocks (DSPs 1106), specialized input/output blocks (I/O 1107) (e.g., configuration ports and clock ports), and other programmable logic 1108 such as digital clock managers, analog-to-digital converters, system monitoring logic, and so forth. Some FPGAs also include dedicated processor blocks (PROC 1110).

In some FPGAs, each programmable tile includes a programmable interconnect element (INT 1111) having standardized connections to and from a corresponding interconnect element in each adjacent tile. Therefore, the programmable interconnect elements taken together implement the programmable interconnect structure for the illustrated FPGA. The programmable interconnect element (INT 1111) also includes the connections to and from the programmable logic element within the same tile, as shown by the examples included at the top of FIG. 11.

For example, a CLB 1102 may include a configurable logic element (CLE 1112) that may be programmed to implement user logic plus a single programmable interconnect element (INT 1111). A BRAM 1103 may include a BRAM logic element (BRL 1113) in addition to one or more programmable interconnect elements. Typically, the number of interconnect elements included in a tile depends on the height of the tile. In the pictured embodiment, a BRAM tile has the same height as four CLBs, but other numbers (e.g., five) may also be used. A DSP tile 1106 may include a DSP logic element (DSPL 1114) in addition to an appropriate number of programmable interconnect elements. An IOB 1104 may include, for example, two instances of an input/output logic element (IOL 1115) in addition to one instance of the programmable interconnect element (INT 1111). As will be clear to those of skill in the art, the actual I/O pads connected, for example, to the I/O logic element 1115 typically are not confined to the area of the input/output logic element 1115.

In the pictured embodiment, a columnar area near the center of the die (shown shaded in FIG. 11) is used for configuration, clock, and other control logic. Horizontal areas 1109 extending from this column are used to distribute the clocks and configuration signals across the breadth of the FPGA.

Some FPGAs utilizing the architecture illustrated in FIG. 11 include additional logic blocks that disrupt the regular columnar structure making up a large part of the FPGA. The additional logic blocks may be programmable blocks and/or dedicated logic. For example, the processor block PROC 1110 shown in FIG. 11 spans several columns of CLBs and BRAMs.

Note that FIG. 11 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 11 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 12:
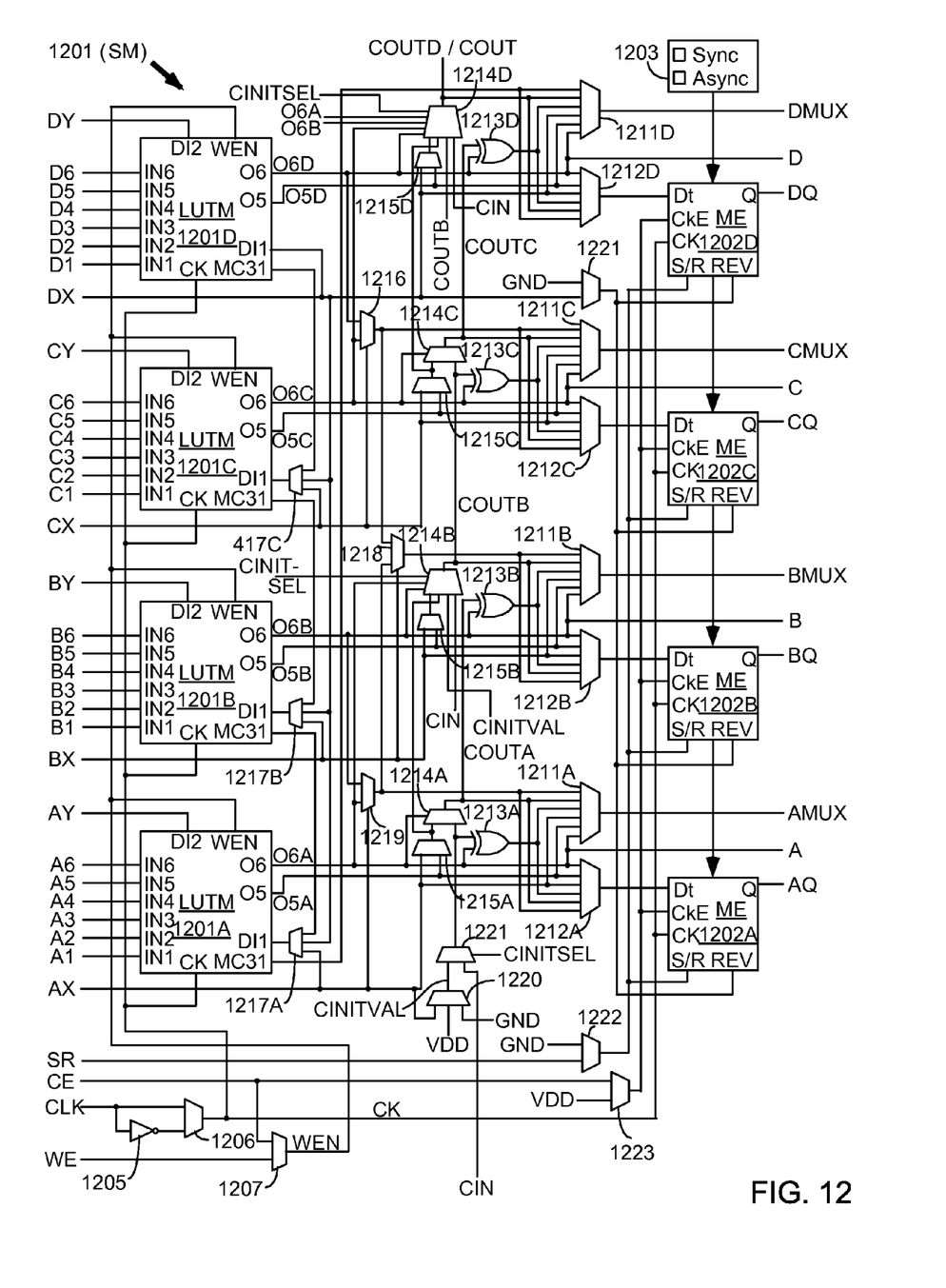
FIG. 12 is a block diagram of a configurable logic element of the device of FIG. 11 according to an embodiment of the present invention.

Turning now to FIG. 12, a block diagram of a configurable logic element of the device of FIG. 11 according to an embodiment of the present invention is shown. In particular, FIG. 12 illustrates in simplified form a configurable logic element of a configuration logic block 1102 of FIG. 11. In the embodiment of FIG. 12, slice M 1201 includes four lookup tables (LUTMs) 1201A-1201D, each driven by six LUT data input terminals A1-A6, B1-B6, C1-C6, and D1-D6 and each providing two LUT output signals O5 and O6. The O6 output terminals from LUTs 1201A-1201D drive slice output terminals A-D, respectively. The LUT data input signals are supplied by the FPGA interconnect structure via input multiplexers, which may be implemented by programmable interconnect element 1211, and the LUT output signals are also supplied to the interconnect structure. Slice M also includes: output select multiplexers 1211A-1211D driving output terminals AMUX-DMUX; multiplexers 1212A-1212D driving the data input terminals of memory elements 1202A-1202D; combinational multiplexers 1216, 1218, and 1219; bounce multiplexer circuits 1222-1223; a circuit represented by inverter 1205 and multiplexer 1206 (which together provide an optional inversion on the input clock path); and carry logic including multiplexers 1214A-1214D, 1215A-1215D, 1220-1221 and exclusive OR gates 1213A-1213D. All of these elements are coupled together as shown in FIG. 12. Where select inputs are not shown for the multiplexers illustrated in FIG. 12, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 12 for clarity, as well as from other selected figures herein.

In the pictured embodiment, each memory element 1202A-1202D may be programmed to function as a synchronous or asynchronous flip-flop or latch. The selection between synchronous and asynchronous functionality is made for all four memory elements in a slice by programming Sync/Asynch selection circuit 1203. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1202A-1202D are clocked by a clock signal CK, which may be provided by a global clock network or by the interconnect structure, for example. Such programmable memory elements are well known in the art of FPGA design. Each memory element 1202A-1202D provides a registered output signal AQ-DQ to the interconnect structure. Because each LUT 1201A-1201D provides two output signals, O5 and O6, the LUT may be configured to function as two 5-input LUTs with five shared input signals (IN1-1N5), or as one 6-input LUT having input signals IN1-IN6.

In the embodiment of FIG. 12, each LUTM 1201A-1201D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1217A-1217C for LUTs 1201A-1201C), or to the two 32-bit RAMs via input terminals DI1 and DI2. RAM write operations in the LUT RAMs are controlled by clock signal CK from multiplexer 1206 and by write enable signal WEN from multiplexer 1207, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1201A may also be provided to the general interconnect structure for shift register chaining, via output select multiplexer 1211D and CLE output terminal DMUX. The devices having programmable logic and methods of the present invention may be implemented according to the device of FIGS. 11 and 12, or in any device, including any type of integrated circuit having programmable logic.

Figure 13:
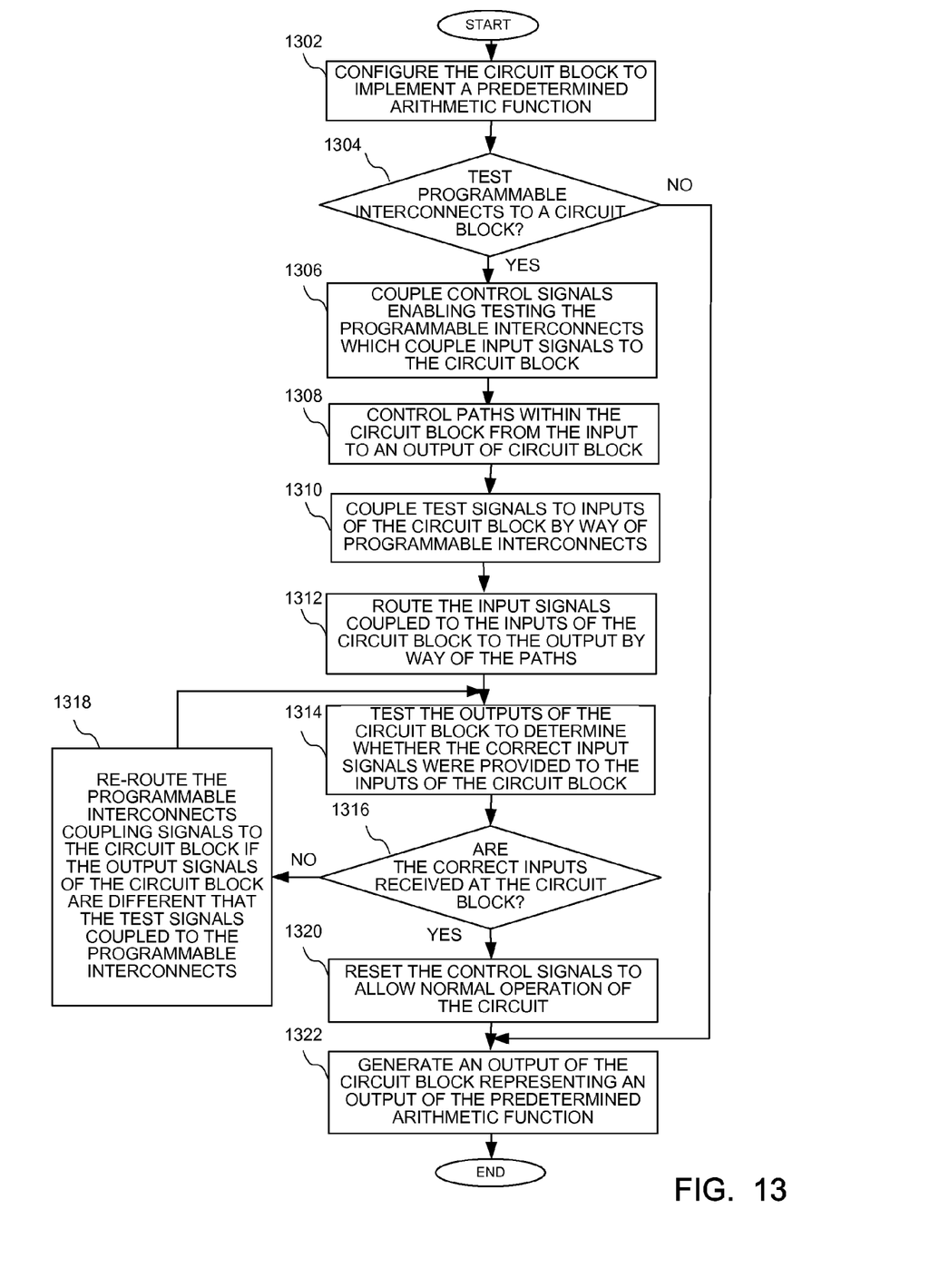
FIG. 13 is a flow chart showing a method of testing input signals coupled to a circuit for performing a predetermined function according to an embodiment the present invention.

Turning now to FIG. 13, a flow chart shows a method of testing input signals coupled to a circuit for performing a predetermined function according to an embodiment the present invention. In particular, the circuit block is configured to implement a predetermined arithmetic function at a step 1302. For example, the circuit block could be a DSP block. It is determined whether to test programmable interconnects to the circuit block at a step 1304. If the programmable interconnects are to be tested, control signals enabling testing the programmable interconnects which couple signals to the circuit block are coupled to the circuit at a step 1306. Paths are then controlled within the circuit block from the input to an output of the circuit block at a step 1308. Test signals are coupled to inputs of the circuit block by way of programmable interconnects at a step 1310. The input signals coupled to the inputs of the circuit block are routed to the output of the circuit block by way of the paths at a step 1312. The outputs of the circuit block are tested to determine whether the correct input signals were provided to the inputs of the circuit block by way of the programmable interconnects at a step 1314. It is then determined whether the correct inputs are received at the circuit block at a step 1316. The programmable interconnects coupling signals to the circuit are re-routed if the output signals of the circuit are different than the test signals coupled to the programmable interconnects at a step 1318. The control signals are reset to enable normal operation of the circuit at a step 1320, and an output of the circuit block representing an output of the predetermined arithmetic function is generated at a step 1322. The method of FIG. 13 may be implemented using any of the circuits of FIGS. 1-12 as described, or other suitable circuits.

It can therefore be appreciated that the new and novel method of testing input signals coupled to a circuit has been described. It will be appreciated by those skilled in the art that numerous alternatives and equivalents will be seen to exist which incorporate the disclosed invention. As a result, the invention is not to be limited by the foregoing embodiments, but only by the following claims.

We claim:

1. A method of testing input signals coupled to a circuit for performing a predetermined function, the method comprising:
   coupling input signals to inputs of the circuit by way of programmable interconnects;
   controlling the paths of the input signals within the circuit from the inputs to an output of the circuit;
   maintaining the states of predetermined input signals coupled to the inputs of the circuit and routed to the output of the circuit; and
   testing output signals of the circuit to determine whether the correct input signals were provided to the inputs of the circuit by way of the programmable interconnects.

2. The method of claim 1 wherein controlling the paths of the input signals within the circuit comprises multiplexing input signals to predetermined nodes of the circuit.

3. The method of claim 1 further comprising providing an arithmetic function implemented in the circuit, wherein controlling the paths of the input signals within the circuit comprises controlling input signals coupled to arithmetic operators to pass predetermined inputs.

4. The method of claim 1 wherein the circuit comprises programmable logic, and wherein controlling the paths of the input signals within the circuit comprises coupling control signals to predetermined multiplexers to selectively pass input signals to the output of the circuit.

5. The method of claim 1 further comprising implementing the circuit to function as a digital signal processing block.

6. The method of claim 5 wherein controlling the paths of the input signals within the circuit comprises controlling inputs to a multiplier of the digital signal processing block.

7. The method of claim 5 wherein controlling the paths of the input signals within the circuit comprises controlling inputs to an adder of the digital signal processing block.

8. A method of testing input signals coupled to a circuit for performing a predetermined function, the method comprising:
   implementing a digital signal processing block in a device;
   coupling input signals to inputs of the digital signal processing block by way of programmable interconnects;
   controlling the paths of the input signals within the digital signal processing block from the inputs to an output of the digital signal processing block;
   maintaining the states of predetermined input signals coupled to the inputs of the digital signal processing block and routed to the output of the digital signal processing block; and
   testing the output signals of the digital signal processing block to determine whether the correct input signals were provided to the inputs of the digital signal processing block by way of the programmable interconnects.

9. The method of claim 8 wherein implementing a digital signal processing block in a device comprises implementing a digital signal processing block in programmable logic of the device.

10. The method of claim 9 further comprising coupling control signals within the device to enable testing the interconnect circuits coupling the input signals to the digital signal processing block.

11. The method of claim 10 wherein controlling the paths of the input signals within the digital signal processing block comprises overriding values of stored configuration bits.

12. The method of claim 8 further comprising coupling test signals to inputs of the digital signal processing block, wherein testing the output signals of the digital signal processing block comprises comparing the output signals to the test signals coupled to the programmable interconnects.

13. The method of claim 12 further comprising re-routing the programmable interconnects coupling the test signals to the digital signal processing block if the output signals of the digital signal processing block are different than the test signals coupled to the programmable interconnects.

14. The method of claim 13 further comprising generating an output of the digital signal processing block representing an output of a predetermined arithmetic function.

15. A circuit for testing input signals, the circuit comprising:
   programmable interconnect circuits coupled to receive input signals;
   a circuit block coupled to the programmable interconnect circuits and implemented in programmable resources for performing arithmetic functions, wherein control signals coupled to the circuit block selectively enable arithmetic operators to pass predetermined input signals received at an input of the circuit block to the programmable interconnects by way of an output of the circuit block, wherein the states of the predetermined input signals are maintained between the input of the circuit block and the output of the circuit block to enable testing the input signals to the circuit block to determine whether the input signals provided to the input of the circuit block are correct.

16. The circuit of claim 15 wherein the circuit block comprises multiplexers for enabling the arithmetic operators to pass the predetermined input signals to the circuit block to outputs of the circuit block.

17. The circuit of claim 15 wherein the circuit block receives a set of configuration bits for configuring the circuit block to perform the arithmetic function.

18. The circuit of claim 17 wherein the circuit block receives control signals for placing the circuit in a test mode.

19. The circuit of claim 18 wherein placing the circuit in a test mode comprises overriding configuration bits coupled to the circuit block.

20. The circuit of claim 17 wherein the circuit block comprises a digital signal processing block and inputs to an adder of the digital signal processing block are controlled to pass the predetermined input signals to the circuit block.

* * * * *